(12) United States Patent
Satou et al.

(10) Patent No.: US 7,952,267 B2
(45) Date of Patent: May 31, 2011

(54) DISPLAY HAVING SUB-PIXEL HAVING LOWER LIGHT-EMISSION EFFICIENCY

(75) Inventors: Tasuku Satou, Kanagawa (JP); Toshiro Takahashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 347 days.

(21) Appl. No.: 12/043,736

(22) Filed: Mar. 6, 2008

(65) Prior Publication Data

US 2008/0225206 A1 Sep. 18, 2008

(30) Foreign Application Priority Data

Mar. 13, 2007 (JP) ................................. 2007-063945

(51) Int. Cl.
*G09G 3/36* (2006.01)
*G09G 3/10* (2006.01)

(52) U.S. Cl. ........ 313/503; 313/504; 313/506; 313/507; 345/89

(58) Field of Classification Search .................. None
See application file for complete search history.

(56) References Cited

U.S. PATENT DOCUMENTS

| 5,317,437 | A | 5/1994 | Katakura et al. |
| 6,501,466 | B1 | 12/2002 | Yamagishi et al. |
| 2003/0222840 | A1* | 12/2003 | Koga et al. ...................... 345/89 |
| 2004/0150352 | A1* | 8/2004 | Koide et al. ................ 315/169.3 |

FOREIGN PATENT DOCUMENTS

| JP | 5-34702 A | 2/1993 |
| JP | 2001-147659 A | 5/2001 |
| JP | 2003-280593 A | 10/2003 |

OTHER PUBLICATIONS

"Organic EL Materials and Displays (Yuuki EL Zairyou to Disupurei)" edited by Junji Kido, pp. 283-284, CMC (2001).

\* cited by examiner

*Primary Examiner* — Nimeshkumar D Patel
*Assistant Examiner* — Tracie Green
(74) *Attorney, Agent, or Firm* — Birch, Stewart, Kolasch & Birch, LLP

(57) ABSTRACT

A display by an active matrix drive in which plural pixels are controlled independently from one another, wherein each of the pixels includes at least two sub-pixels, the sub-pixels emit light of the same color as each other by application of current, and one sub-pixel of the sub-pixels has a lower light-emission efficiency per unit of current than that of the other sub-pixel. A display which has an improved gradation and is capable of multi-gradation reproduction is provided.

8 Claims, 4 Drawing Sheets

☐: conventional example

☐: the invention (sub-pixel with higher light-emitting efficiency)

○: the invention (sub-pixel with lower light-emitting efficiency)

DISPLAY HAVING SUB-PIXEL HAVING LOWER LIGHT-EMISSION EFFICIENCY

CROSS-REFERENCE TO RELATED APPLICATION

This application claims priority under 35 USC 119 from Japanese Patent Application No. 2007-063945, the disclosure of which is incorporated by reference herein.

BACKGROUND OF THE INVENTION

1. Field of the Invention

The present invention relates to a display using a light-emitting element. In particular, the invention relates to a display that has improved gradation reproduction and is capable of multi-gradation reproduction.

2. Description of the Related Art

Recently, flat panel displays with a thin shape and light weight have been used in wide fields in replace of Braun tubes (CRTs), and applications thereof have been expanded. This has resulted from the accelerated spread of personal information terminals such as personal computers and cellular telephones compatible with network access, due to the development of information devices and infrastructure for service networks using the Internet as a core. In addition, the market for flat panel displays has expanded to home use television sets, which was conventionally the exclusive market of CRTs.

Liquid crystal displays (LCDs) have already come to occupy a large market share due to such characteristics as a thin shape and light weight and low power consumption, but there are disadvantages to be improved with respect to some display characteristics, such as a viewing angle, contrast and response speed. Accordingly, on the one hand, the improvement of LCDs themselves has been advanced, and research and development with respect to displays based on completely different devices or principles have also been actively conducted.

Among these, as a device recently getting a lot of attention in particular, there is an organic electroluminescence display (OELD). An OELD is a display that emits light corresponding to electric signals and is constituted using an organic compound as a light-emitting material. The OELD inherently has excellent display characteristics such as a wide viewing angle, high contrast and high-speed response. Further, there is a possibility that it can realize displays of from a small size to a large size with a thin shape and light weight and a high image quality. Therefore, it has attracted attention as a display capable of replacing CRTs and LCDs.

Concerning a driving technique of a matrix panel arranged with plural pixels, for OELDs as well, both duty driving (time-division driving) and static driving have been developed, similarly as in the case of displays such as LCDs.

The former has a simple panel structure resulting in a simple and low cost process. However, when the number of scanning lines increases, the emission period of respective lines relative to the period for scanning the whole screen decreases. As a result, for the purpose of obtaining required panel brightness, the peak brightness of pixels becomes high. When compared with driving conditions of full-time lighting, usually, this results in a poor light-emission efficiency to require driving by high voltage or current.

Further, due to power loss in wiring portions, the larger a screen becomes, the more disadvantageous this is with respect to power consumption.

In contrast, since the latter is combined with nonlinear elements such as a thin film transistor (TFT), the process becomes complex. However, since such a constitution is possible in which an emission duration is maintained for the scanning period of one line, or longer, low power consumption and long operating life can be expected due to the decrease in the peak brightness of pixels and current.

As the TFT, a TFT of poly-silicon (p-Si) type such as continuous grain silicon (CGS) that has a high density patterning and high current driving performance is preferable. A high mobility and integration property, which are characteristics of the p-Si type TFT as an element, also make it possible to build such constituents as a driving IC (integrated circuit) and control circuit into a panel. For these reasons, technical development for active driving of an OELD is currently the main stream.

When performing active driving, the driving current necessary for obtaining a predetermined brightness per one pixel is several micro amperes at the maximum, and, in order to obtain a wide range of gradation reproduction, the minimum difference in current between respective gradations is a very minute value of several tens of nanoamperes. Control of variation of a TFT manufactured in an ordinary manner occurs at a range of current value that exceeds this minute current value. Therefore, there occurs such gradation trouble as the reversion of brightness due to the variation. Accordingly, as a method for controlling such a very minute current with a TFT, for example, Japanese Patent Application Laid-Open (JP-A) No. 2001-147659 discloses generating a driving current with an exterior driving circuit, performing writing to a writing capacitor in a pixel by a driving current generated through the improvement of a TFT circuit in a pixel to enable an organic EL element to be driven with the driving current, thereby compensating for the variation in characteristics of a TFT in the pixel circuit to reduce the brightness variation. However, there are such problems to be solved in that one more TFT is required for controlling the TFT and heavy equipment is required for lowering the current and voltage of a TFT driving device.

Along with even more fine reproduction of a display, and further improvement of light-emission efficiency of a light-emitting element, the minimum current value to be controlled tends to be reduced more and more. Thus, a controlling method that has higher reliability and is convenient and compact is required.

JP-A No. 2003-280593, for example, discloses a display provided with a first sub-pixel for displaying multi-gradation including a halftone and a second sub-pixel having a lower number of gradations. The first sub-pixel is controlled by an offset voltage switching means that switches an offset voltage on the basis of the comparison between an analog signal and a reference signal, and the second sub-pixel is controlled by binary values of lightness and darkness. However, organic electroluminescence elements by voltage control have such a problem in that the brightness varies largely according to temperature variation, and are not practical. On the other hand, JP-A No. 5-34702 discloses a liquid crystal display provided with sub-pixels having different areas from each other. The gradation of the liquid crystal display is also controlled by voltage, but, for a display in which gradation is controlled by current, it is impossible to perform gradation reproduction with a high reliability only by providing sub-pixels having different areas from each other.

Regarding the current control and voltage control in an organic EL element, there is detailed description in "Organic EL Materials and Displays (Yuuki EL Zairyou to Disupurei)" edited by Junji Kido, pages 283-284, CMC (2001). Driving of an organic EL element is based on direct current driving in which a hole and an electron are injected into a light-emitting layer by applying a direct current electric field between an anode and a cathode, and the driving results from the fact that the emission brightness in the organic EL is proportional to a value of the driving current. As shown on page 284, FIG. 3 of the above reference, the current and the brightness show very good linear relationship, and therefore, it is understood that the brightness can be stably controlled by current values. However, as shown in FIG. 4 on the same page of the reference, voltage and brightness are in a relationship similar to ON/OFF characteristics, which is suitable for pulse modulation control, but, in the case where it is used for the brightness control of an organic EL element, the brightness varies significantly according to a slight variation in voltage, which is not preferable. In particular, it is extremely difficult to display an image having multi-gradation with good reproduction by a voltage control system.

Even in the case of a current control system, multi-gradation reproduction of images is not yet sufficient, and means for image reproduction having multi-gradation by a current control system is desired even further.

SUMMARY OF THE INVENTION

The present invention has been made in view of the above circumstances and provides a display with the following aspect.

An aspect of the present invention is to provide a display comprising an active matrix drive in which plural pixels are controlled independently from one another, wherein each of the pixels includes at least two sub-pixels, the sub-pixels emit light of the same color as each other by application of current, and one sub-pixel of the sub-pixels has a lower light-emission efficiency per unit of current than that of the other sub-pixel.

DETAILED DESCRIPTION OF THE INVENTION

Figure 1:
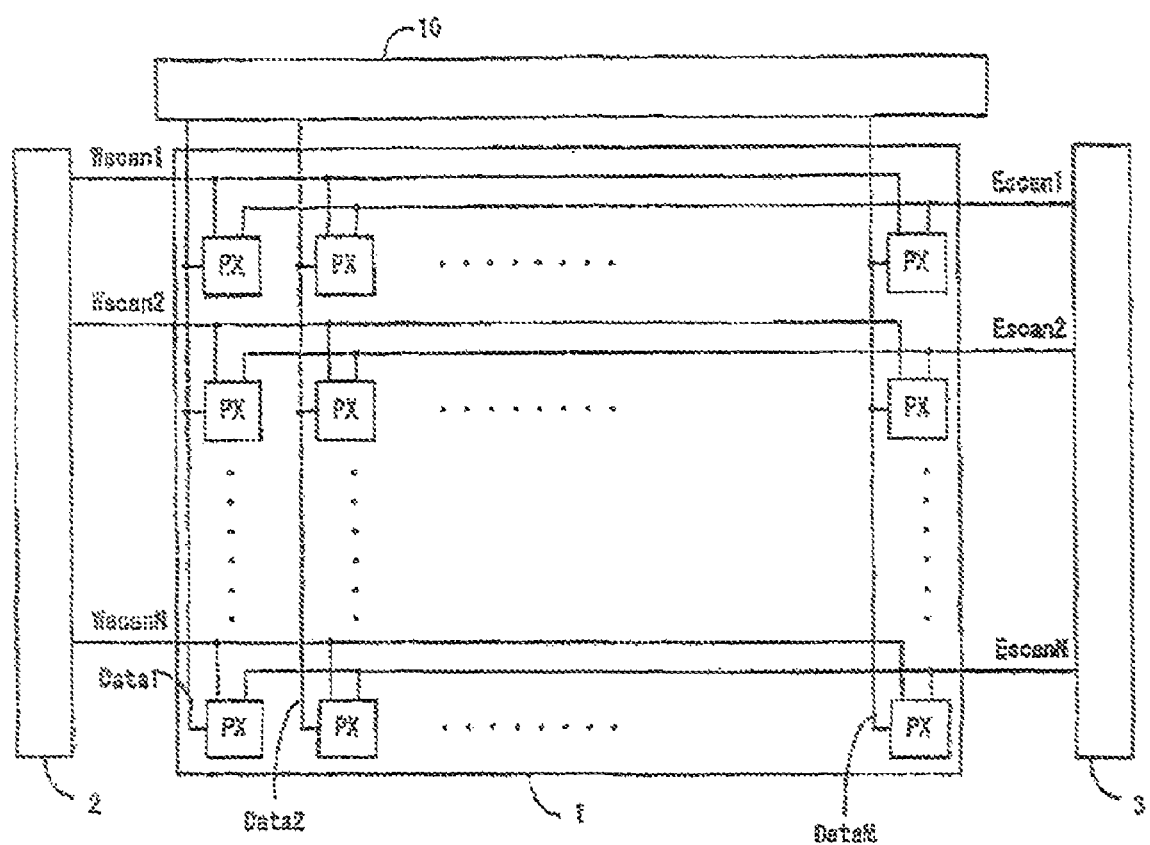
FIG. 1 is a circuit diagram showing a display comprising a conventional active matrix drive.

An object of the present invention is to provide a display that uses light-emitting elements. In particular, an object of the present invention is to provide a display that has an improved gradation control and is capable of stable multi-gradation reproduction.

The above objects of the invention were achieved by a display comprising an active matrix drive in which plural pixels are controlled independently from one another, wherein each of the pixels includes at least two sub-pixels, the sub-pixels emit light of the same color as each other by application of current, and one sub-pixel of the sub-pixels has a lower light-emission efficiency per unit of current than that of the other sub-pixel.

Preferably, the light-emission efficiency of the sub-pixel a having a lower light-emission efficiency is from 5% to 60% with respect to the light-emission efficiency of the sub-pixel having a higher light-emission efficiency.

Preferably, the light-emitting area of the sub-pixel having a lower light-emission efficiency is smaller than the light-emitting area of the sub-pixel having a higher light-emission efficiency. More preferably, the light-emitting area of the sub-pixel having a lower light-emission efficiency is from 0.01% to less than 100% with respect to the light-emitting area of the sub-pixel having a higher light-emission efficiency.

Preferably, a number of gradations of the sub-pixel having a lower light-emission efficiency is smaller than a number of gradations of the sub-pixel a having a higher light-emission efficiency. More preferably, a ratio of the number of gradations of the sub-pixel having a lower light-emission efficiency relative to the number of gradations of the sub-pixel having a higher light-emission efficiency is from 0.01% to 100%.

Preferably, the pixel has a charge-injection type light-emitting element, and a gradation reproduction is controlled by current values.

Preferably, the light-emitting element is an organic electroluminescence element. More preferably, the organic electroluminescence element contains a phosphorescent light-emitting material as a light-emitting material. Further preferably, a light-emitting material of the sub-pixel having a higher light-emission efficiency is the phosphorescent light-emitting material.

Preferably, the organic electroluminescence element is a top emission organic electroluminescence element.

Preferably, the display is a full color display.

By the present invention, a display, which has an improved gradation reproduction and is capable of multi-gradation reproduction, is provided.

According to the invention, by arranging a sub-pixel having a lower light-emission efficiency for every pixel, the reproduction of multi-gradation is achieved stably within a range of current capable of stable control. Consequently, since the reliability of gradation control is improved, it becomes possible to realize high image quality even for a large screen display.

1. Display

The display of the invention has plural pixel portions comprising a pixel having a spontaneous light-emitting element and an active element for independently driving and controlling the pixel, wherein the pixel has at least two sub-pixels. The sub-pixels are characterized in that they emit light having the same color as each other by application of current and have a different light-emission efficiency per unit of current from each other, wherein the light-emission efficiency of one pixel is lower than that of the other pixel. The light-emission efficiency of the sub-pixel having a lower light-emission efficiency is preferably from 5% to 60% with respect to the light-emission efficiency of the sub-pixel having a higher light-emission efficiency. The light-emission efficiency of the sub-pixel having a lower light-emission efficiency is more preferably from 10% to 50% with respect to the light-emission efficiency of the sub-pixel having a higher light-emission efficiency, and even more preferably from 20% to 40%.

In the case where the light-emission efficiency of the sub-pixel having a lower light-emission efficiency exceeds 60% with respect to the light-emission efficiency of the sub-pixel having a higher light-emission efficiency, the allowable range of the value of controlling current becomes narrow, which is not preferable.

In the case where the light-emission efficiency of the sub-pixel having a lower light-emission efficiency is less than 5% with respect to the light-emission efficiency of the sub-pixel having a higher light-emission efficiency, the power consumption of the display increases, which is not preferable.

Preferably, the light-emitting area of the sub-pixel having a lower light-emission efficiency is smaller than the light-emitting area of the sub-pixel having a higher light-emission efficiency.

The ratio of the light-emitting area of the sub-pixel having a lower light-emission efficiency relative to the light-emitting area of the sub-pixel having a higher light-emission efficiency is more preferably from 0.01% to 100%, more preferably from 1% to 50%, and most preferably from 3% to 30%. In the case where the ratio is 100% or more, the power consumption of the display increases, which is not preferable. In the case where the ratio is less than 0.01%, the production and processing of the sub-pixel having a lower light-emission efficiency are difficult, which is not preferable.

The number of gradations of the sub-pixel having a lower light-emission efficiency is, preferably, smaller than the number of gradations of the sub-pixel having a higher light-emission efficiency.

The ratio of the number of gradations of the sub-pixel having a lower light-emission efficiency relative to the number of gradations of the sub-pixel having a higher light-emission efficiency is preferably from 0.01% to 100%, more preferably from 1% to 50%, and even more preferably from 3% to 30%. By maintaining the ratio of the number of gradations within this range, the gradation reproduction becomes possible within a range of current values that can be controlled stably.

As a method in order to obtain the ratio of light-emission efficiency of sub-pixels, the brightness of the display is measured while only the sub-pixel having a lower efficiency among sub-pixels of a display is turned on by application of a certain current density. Further, the brightness of the display is measured while only the sub-pixel having a higher efficiency is driven at a current value that gives the same current density as described above. For measuring the brightness, a spectral radiance meter is used and a display is arranged so that a large number of sub-pixels to be measured exist within a range of the measurement. The ratio of light-emission efficiency is obtained by dividing respective measurement results by the aperture ratio (light-emitting area of sub-pixel/pixel area) of respective sub-pixels and then calculating the ratio of resulting values. In the invention, the value (value for a lower efficiency sub-pixel/value for a higher efficiency sub-pixel) is preferably 0.5 or less, and particularly preferably 0.33 or less.

The display of the invention is not particularly limited, but can be used for various known displays that require multi-gradations.

In displays, it is possible to reproduce a number of colors corresponding to a number obtained by multiplying respective gradation numbers that can be reproduced by respective emission colors (for example, R, G, B). For example, when respective colors are of binary expression, a display of 8-color reproduction is given. A larger number of colors capable of reproduction makes it possible to display sharper and higher contrast images, and therefore the gradation number of respective colors is preferably increased as far as possible.

However, for conventional light-emitting elements controlled by current, as described above, a current value to be controlled is very minute. Therefore, it is difficult to control the multi-gradation with good reliability (it depends on the performance of a current controlling system such as TFT). According to the constitution of the present invention, it becomes possible to realize multi-gradation within a range of current value that can be controlled by TFT with good reliability.

The display according to the present invention may suitably be used for mono color and full color displays. Examples of mono color displays include a multi-gradation display for displaying X-ray photographs, and the like. Examples of full color displays include home-use TV displays, and the like.

The above-described pixel preferably includes a charge-injection light-emitting element, and more preferably an organic electroluminescence element (in the invention, hereinafter, it is sometimes referred to as an "organic EL element"). Particularly preferably, it is a top emission organic electroluminescence element.

Preferably the display is a full color display.

Next, the display of the invention is specifically described while referring to the drawings.

FIG. 1 is a constitutional drawing of a display. This display is, for example, an organic EL display utilizing an organic EL element. A display panel 1 is provided with plural first scanning lines Wscan 1 to Wscan N and plural second scanning lines Escan 1 to Wscan N arranged in the horizontal direction, plural data lines Data 1 to Data M arranged in the vertical direction, and sub-pixels, PXes, arranged at crossing positions thereof. Then, within frame duration, a first scanning line driving circuit 2 scans the first scanning lines Wscan 1 to Wscan N, and a second scanning line driving circuit 3 scans the second scanning lines Escan1-N, respectively and sequentially, and, within respective scanning durations, a data line driving circuit 10 supplies write-in current Iw corresponding to brightness information to data lines Data 1 to Data M. In the display of the invention, the PX is constituted of, for example, a repetition of LR (red-emitting sub-pixel having a higher light-emission efficiency), sR (red-emitting sub-pixel having a lower light-emission efficiency), LR, sR, LR and the like, in the vertical direction, and constituted of, for example, a repetition of LR, LG, LB, LR, LG, LB and the like in the horizontal direction.

Figure 2:
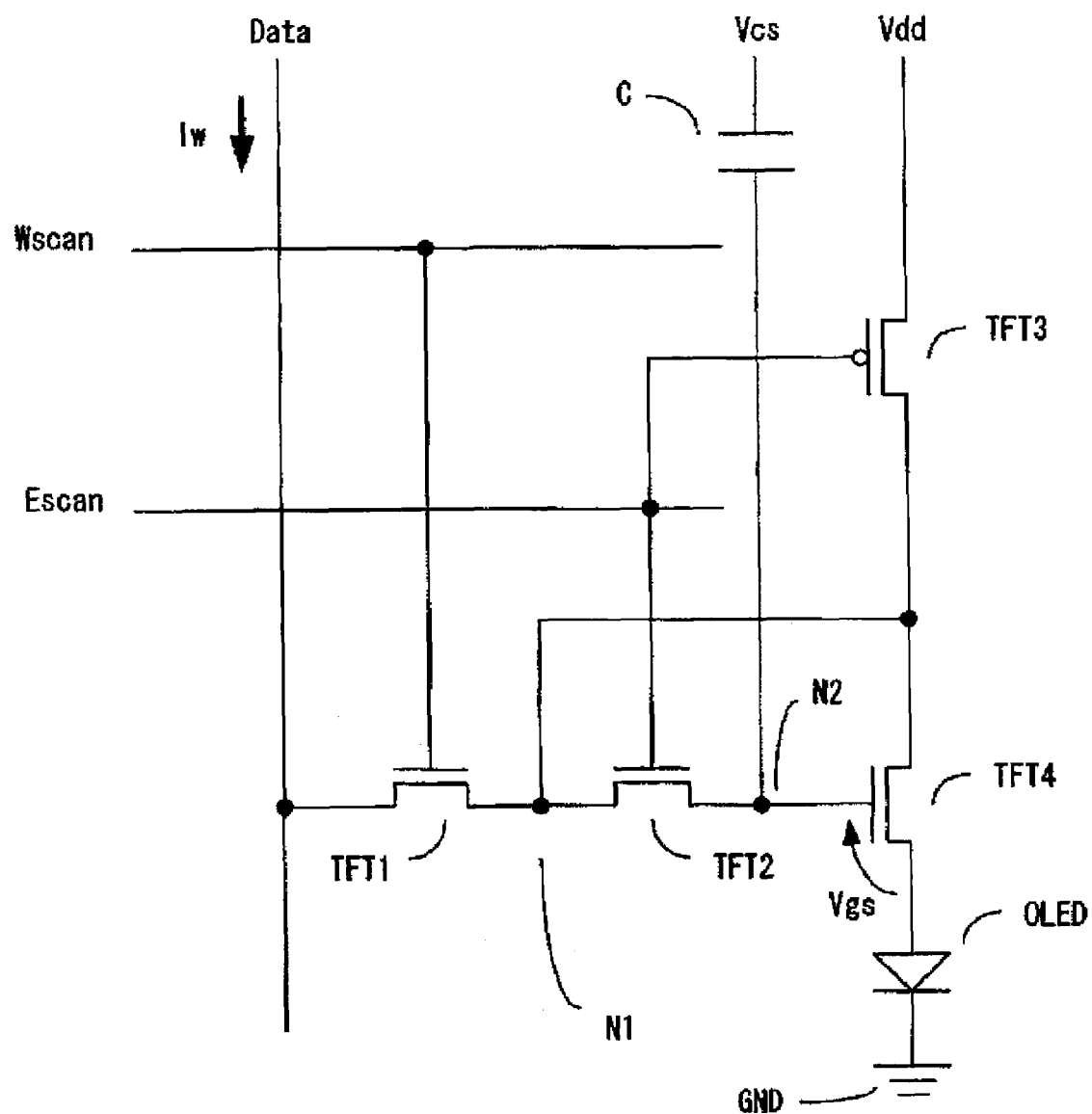
FIG. 2 is a circuit diagram showing one embodiment of a display comprising an active matrix drive according to the present invention.

FIG. 2 is a drawing that shows a pixel circuit of the display of the present embodiment. The sub-pixel PX includes a light-emitting element OLED such as an organic EL element that emits light with brightness corresponding to a drive current, a drive transistor TFT 4 that supplies a drive current to the light-emitting element OLED, a third transistor TFT 3 that connects the drain of the drive transistor TFT 4 to a power source Vdd, a first transistor TFT 1 whose gate is connected to the first scanning line Wscan, a second transistor TFT 2 whose gate is connected to the second scanning line Escan, and a condenser C arranged between the gate of the drive transistor TFT 4 and a predetermined constant voltage source Vcs. Only the third transistor TFT 3 is a P-type transistor, and the other transistors are N-type transistors.

Figure 3:
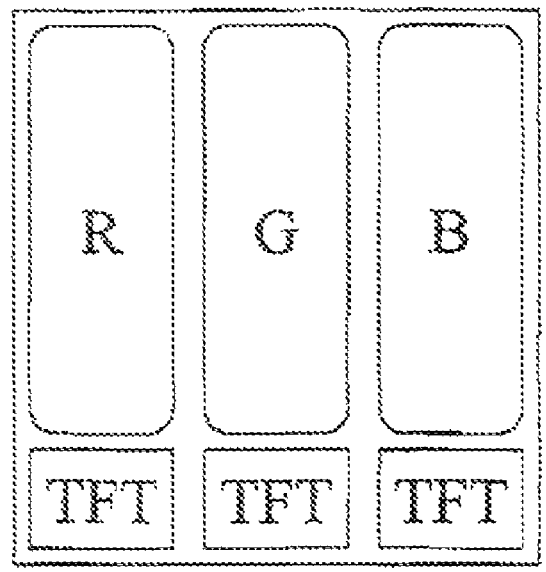
FIG. 3 is a conceptual diagram of a conventional alignment of pixels.

FIG. 3 schematically shows a conventional pixel array. In the array, sub-pixels of red, green and blue necessary for displaying an image in fill color are arrayed, wherein each of the sub-pixels emits light with a desired brightness, respectively, to reproduce an intended color. The number of reproducible colors is determined according to the number of gradations of sub-pixel for respective colors. For example, in the case where each of colors expresses 256 gradations, about 16,770,000 colors can be reproduced. At this time, for example, if a current value per one sub-pixel for reproducing the maximum gradation (maximum current value) is 4 μA, the difference in current values between the gradations is 15.6 nA, based on a simple calculation. It is very difficult to control this minute current with a conventional TFT with high reproducibility under the influence of wiring capacity and the like.

Figure 4:
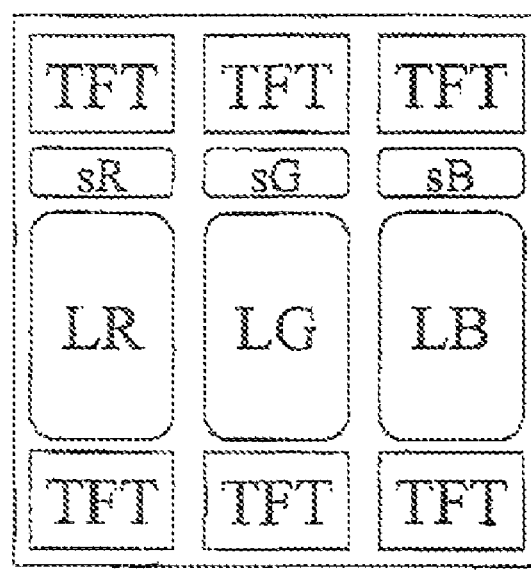
FIG. 4 is a conceptual diagram of an alignment of pixels including sub-pixels according to the invention.
Figure 5:
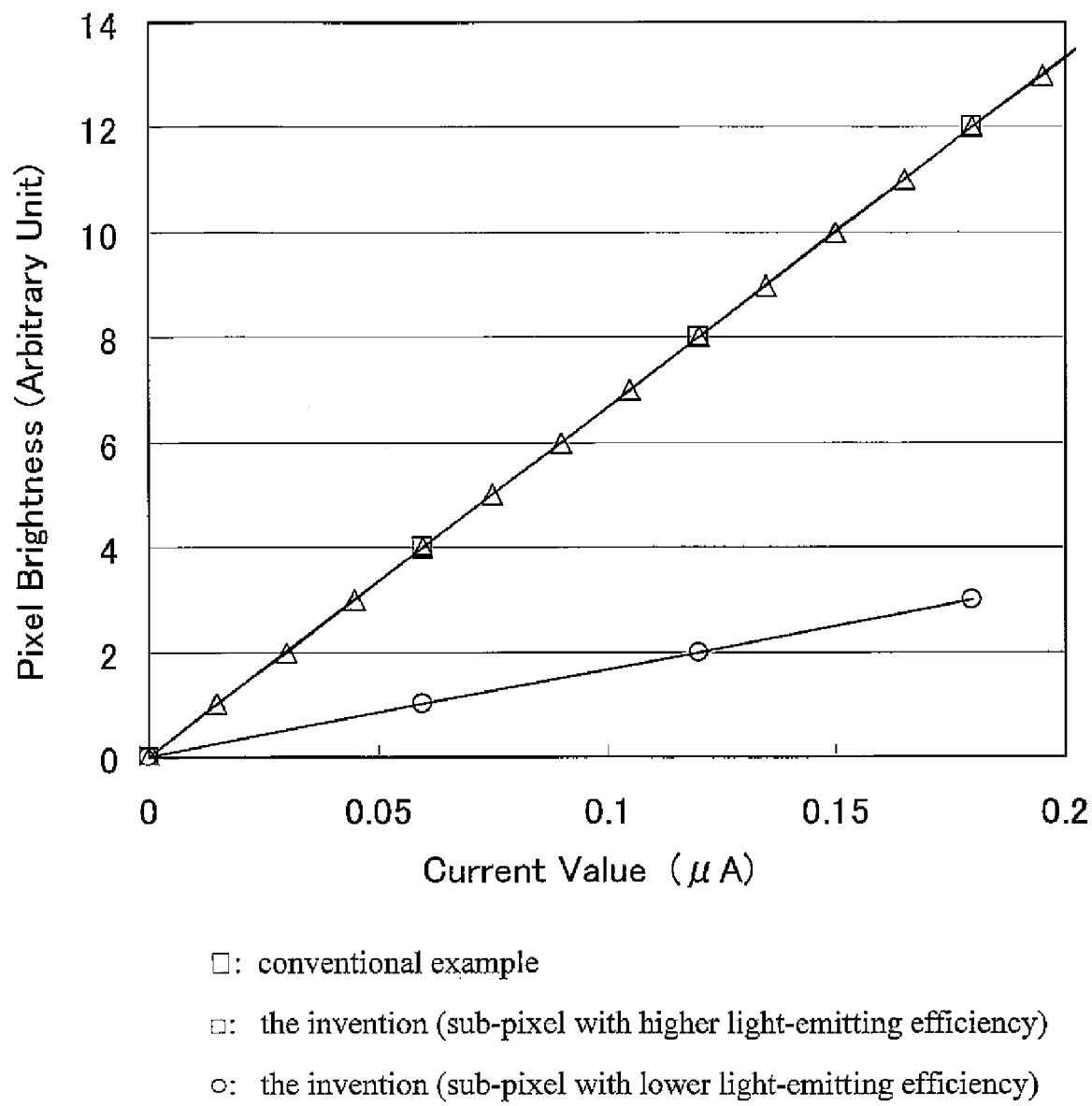
FIG. 5 is a conceptual diagram showing the relationship between a current value and emission brightness. The horizontal axis shows a driving current value for an element, and the vertical axis shows emission brightness corresponding to respective current values, relatively in arbitrary units. The mark (Δ) represents brightness in a conventional pixel alignment with no brightness difference. The mark (□) represents the brightness of a sub-pixel having a higher light-emission efficiency in a pixel alignment according to the invention. The mark (○) represents the brightness of a sub-pixel having a lower light-emission efficiency in a pixel alignment according to the invention.

FIG. 4 shows a pixel array according to the invention. In the invention, sub-pixels having a lower light-emission efficiency are arranged. For each of colors, as shown in FIG. 4, sub-pixels sR, sG and sB having a lower a light-emission efficiency are added to sub-pixels LR, LG and LB, respectively. Sub-pixels LR, LG and LB are sub-pixels having a higher light-emission efficiency, and having a larger area. Each of LR, LG, LB sub-pixels reproduces 64 gradations, and each of sR, sG and sB reproduces 4 gradations, respectively. Consequently, 256 gradations can be reproduced for respective colors. Sub-pixels sR, sG and sB have light-emission efficiency of, for example, around a quarter of that of sub-pixels LR, LG and LB, and, as shown in FIG. 5, the difference in current values between gradations is around 62 nA, which is 4 times lager than that in the conventional case.

As is clear from the above current value, this means around 4 times larger tolerance level than that of conventional constitutions is obtained for current value variation. By leaving fine gradation reproduction to sub-pixels sR, sG and sB, the display of approximately 16,770,000 color reproduction with 256 gradations for respective colors can be realized. In other words, it is sufficient to reduce the number of gradations and light-emission efficiency of sR, sG and sB so that the minimum control current value between gradations is a current value that is controllable with high reliability. However, in the case where only the area of sub-pixel is varied without varying the light-emission efficiency, the controlled current value does not vary, and thus, no advantage is obtained in the case of current control.

On the other hand, according to the invention, by providing sub-pixels having a higher light-emission efficiency and sub-pixels having a lower light-emission efficiency in pairs for every pixel, it is possible to reproduce multi-gradations within a range of current that is controllable stably. According to the invention, since the reliability of gradation control is improved, it becomes possible to realize high image quality even for large screen displays.

The light-emission efficiency may be lowered by any means. Such a method may be employed as using a material having a low efficiency for a light-emitting material of an organic EL element and other organic raw materials, or changing the constitution of layers.

As a means for lowering the light-emission efficiency, a method of varying a light-emitting material may also be employed. For example, a phosphorescent light-emitting material may be used for a sub-pixel having a higher light-emission efficiency and a fluorescent light-emitting material for a sub-pixel having a lower light-emission efficiency. Further, even when the same materials are used for the light-emitting material, the light-emission efficiency can also be varied, for example, by varying the dope concentration of the light emitting layer. In this case, the concentration is preferably varied in such a range that does not largely vary the emission color.

Furthermore, the light-emission efficiency may also be varied by varying a thickness of the organic layer. As the variation in the thickness of respective layers of a light-emitting element often results in a variation of carrier balance, it is possible to control the light-emission efficiency by varying the thickness thereof. In addition, as the variation of the thickness leads to a variation of the light extraction efficiency based on the interference effect of light, the light-emission efficiency observed by an observer is also varied. Suitable conditions may be selected from the standpoint of emitting color and light-emission efficiency.

The light-emission efficiency may also be controlled by selecting the material for an electrode or varying the thickness of the electrode. In the case of ordinary organic EL elements, one of a pair of electrodes is transparent. Otherwise, by using a translucent electrode instead of a transparent electrode for a sub-pixel, which is intended to have lowered light-emission efficiency, the efficiency may also be regulated.

2. Organic EL Element

The organic electroluminescence element according to the present invention may include a known organic compound layer including as a hole transport layer, an electron-transport layer, a blocking layer, an electron injection layer, a hole injection layer, and the like as well as a light emitting layer.

In the following, the explanation will be presented in more detail.

1) Layer Constitution

<Electrode>

At least one of a pair of electrodes of the organic electroluminescence device of the present invention is a transparent electrode, and the other one is a rear surface electrode The rear surface electrode may be transparent or non-transparent.

<Constitution of Organic Compound Layer>

A layer constitution of the organic compound layer can be appropriately selected, without particular restriction, depending on an application of the organic electroluminescence device and an object thereof. However, the organic compound layer is preferably formed on the transparent electrode or on the rear surface electrode. In these cases, the organic compound layer is formed on front surface or on one surface on the transparent electrode or the rear surface electrode.

A shape, size and thickness of the organic compound layer can be appropriately selected, without particular restriction, depending on applications thereof.

Specific examples of layer constitution include those cited below, but the present invention is not restricted to those constitutions.

Anode/hole-transport layer/light emitting layer/electron-transport layer/cathode, Anode/hole-transport layer/light emitting layer/blocking layer/electron-transport layer/cathode, Anode/hole-transport layer/light emitting layer/blocking layer/electron-transport layer/electron-injection layer/cathode, Anode/hole-injection layer/hole-transport layer/light emitting layer/blocking layer/electron-transport layer/cathode, and Anode/hole-injection layer/hole-transport layer/light emitting layer/blocking layer/electron-transport layer/electron-injection layer/cathode.

Each layer will be described in detail below.

2) Hole-Transport Layer

The hole-transport layer that is used in the present invention includes a hole transporting material. For the hole transporting material, any material can be used without particular restriction as far as it has either one of a function of transporting holes or a function of blocking electrons injected from the cathode. As the hole transporting material that can be used in the present invention, either one of a low molecular weight hole transporting material and a polymer hole transporting material can be used.

Specific examples of the hole transporting material that can be used in the present invention include a carbazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, a polysilane-based compound, a poly(N-vinylcarbazole) derivative, an aniline-based copolymer, electric conductive polymers or oligomers such as a thiophene oligomer and polythiophene, and high molecular compounds such as a polythiophene derivative, a polyphenylene derivative, a polyphenylenevinylene derivative and a polyfluorene derivative.

These compounds may be used alone or in a combination of two or more of them.

A thickness of the hole-transport layer is preferably from 10 nm to 400 nm and more preferably from 50 nm to 200 nm.

3) Hole-Injection Layer

In the present invention, a hole-injection layer may be disposed between the hole-transport layer and the anode.

The hole-injection layer is a layer that makes it easy for holes to be injected easily from the anode to the hole-transport layer, and specifically, a material having a small ionization potential among the hole transporting materials cited above is preferably used. For instance, a phthalocyanine compound, a porphyrin compound and a star-burst type triarylamine compound can be preferably used.

A film thickness of the hole-injection layer is preferably form 1 nm to 300 nm.

4) Light-Emitting Layer

A light-emitting layer in the present invention comprises at least one light emitting material, and may comprise as necessary other compounds such as a positive hole transporting material, an electron transporting material, and a host material.

Any of light emitting materials can be used without particular restriction. Either of fluorescent emission materials or phosphorescent emission materials can be used, but the phosphorescent emission materials are preferred in view of the light-emission efficiency.

Examples of the above-described fluorescent emission materials include, for example, a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumalin derivative, a perylene derivative, a perinone derivative, an oxadiazole derivative, an aldazine derivative, a pyralidine derivative, a cyclopentadiene derivative, a bis-styrylanthracene derivative, a quinacridone derivative, a pyrrolopyridine derivative, a thiadiazolopyridine derivative, a styrylamine derivative, aromatic dimethylidene compounds, a variety of metal complexes represented by metal complexes or rare-earth complexes of a 8-quinolynol derivative, polymer compounds such as a polythiophene derivative, a polyphenylene derivative, a polyphenylenevinylene derivative, a polyfluorene derivative, and the like. These compounds may be used singularly or in a combination of two or more.

The phosphorescent emission material is not particularly limited, but an ortho-metal complex or a porphyrin metal complex is preferred.

The ortho-metal complex referred to herein is a generic designation of a group of compounds described in, for instance, Akio Yamamoto, Yuki Kinzoku Kagaku, Kiso to Oyo ("*Organic Metal Chemistry, Fundamentals and Applications*") (Shokabo, 1982), pages. 150 to 232, and H. Yersin, *Photochemistry and Photophysics of Coordination Compounds* (New York: Springer-Verlag, 1987), pages 71-77 and pages 135-146. The ortho-metal complex can be advantageously used as a light emitting material because high brightness and excellent light-emission efficiency can be obtained.

As a ligand that forms the ortho-metal complex, various groups can be cited and are described in the above-mentioned literature as well. Examples of preferable ligands include a 2-phenylpyridine derivative, a 7,8-benzoquinoline derivative, a 2-(2-thienyl)pyridine derivative, a 2-(1-naphtyl)pyridine derivative and a 2-phenylquinoline derivative. The derivatives may be substituted by a substituent as needs arise. Furthermore, the ortho-metal complex may have other ligands than the ligands mentioned above.

An ortho-metal complex used in the present invention can be synthesized according to various known methods such as those described in Inorg. Chem., 1991, vol. 30, page 1685, Inorg. Chem., 1988, vol. 27, page 3464; Inorg. Chem., 1994, vol. 33, page 545; Inorg. Chim. Acta, 1991, vol. 181, page 245; J. Organomet. Chem., 1987, vol. 335, page 293 and J. Am. Chem. Soc., 1985, vol. 107, page 1431.

Among the ortho-metal complexes, compounds emitting light from a triplet exciton can be preferably employed in the present invention from the viewpoint of improving light emission efficiency.

Furthermore, among the porphyrin metal complexes, a porphyrin platinum complex is preferable.

The phosphorescent light emitting materials may be used alone or in a combination of two or more of them. Furthermore, a fluorescent emission material and a phosphorescent emission material may be simultaneously used.

A host material is a material that has a function of causing an energy transfer from an excited state thereof to the fluorescent emission material or the phosphorescent emission material to cause light emission from the fluorescent emission material or the phosphorescent emission material.

As the host material, as long as a compound can transfer exciton energy to a light emitting material, any compound can be appropriately selected and used depending on an application without particular restriction. Specific examples thereof include: a carbazole derivative; a triazole derivative; an oxazole derivative; an oxadiazole derivative; an imidazole derivative; a polyarylalkane derivative; a pyrazoline derivative; a pyrazolone derivative; a phenylenediamine derivative; an arylamine derivative; an amino-substituted chalcone derivative; a styrylanthracene derivative; a fluorenone derivative; a hydrazone derivative; a stilbene derivative; a silazane derivative; an aromatic tertiary amine compound; a styrylamine compound; an aromatic dimethylidene-based compound; a porphyrin-based compound; an anthraquinonedimethane derivative; an anthrone derivative; a diphenylquinone derivative; a thiopyran dioxide derivative; a carbodiimide derivative; a fluorenylidenemethane derivative; a distyrylpyrazine derivative; heterocyclic tetracarboxylic anhydrides such as naphthalene perylene; a phthalocyanine derivative; various metal complexes represented by metal complexes of a 8-quinolinol derivative, metal phthalocyanine, and metal complexes with benzoxazole or benzothiazole as a ligand; polysilane compounds; a poly(N-vinylcarbazole) derivative; an aniline-based copolymer; electric conductive polymers or oligomers such as a thiophene oligomer and polythiophene; polymer compounds such as a polythiophene derivative, a polyphenylene derivative, a polyphenylenevinylene derivative and a polyfluorene derivative; and like. These compounds can be used alone or in a combination of two or more of them.

A content of the host material in the light-emitting layer is preferably in a range from 0 by weight % to 99.9 by weight %, and more preferably in a range of 0 by weight % to 99.0 by weight %.

5) Blocking Layer

In the present invention, a blocking layer may be disposed between the light-emitting layer and the electron-transport layer. The blocking layer is a layer that inhibits excitons generated in the light-emitting layer from diffusing and holes from penetrating to a cathode side.

A material that is used in the blocking layer may be a general electron transporting material, as long as it can receive electrons from the electron-transport layer and deliver them to the light-emitting layer, without being particularly restricted. Examples thereof include a triazole derivative; an oxazole derivative; an oxadiazole derivative; a fluorenone derivative; an anthraquinodimethane derivative; an anthrone derivative; a diphenylquinone derivative; a thiopyran dioxide derivative; a carbodiimide derivative; a fluorenylidenemethane derivative; a distyrylpyrazine derivative; heterocyclic tetracarboxylic anhydrides such as naphthalene perylene; a phthalocyanine derivative; various metal complexes represented by metal complexes of a 8-quinolinol derivative, metal phthalocyanine, and metal complexes with benzoxazole or benzothiazole as a ligand; electric conductive polymer oligomers such as an aniline-based copolymer, a thiophene oligomer and polythiophene; and polymer compounds such as a polythiophene derivative, a polyphenylene derivative, a polyphenylenevinylene derivative and a polyfluorene derivative. These can be used alone or in a combination of two or more of them.

6) Electron-Transport Layer

In the present invention, an electron-transport layer including an electron transporting material can be disposed.

The electron transporting material can be used without particular restriction, as long as it has either one of a function of transporting electrons or a function of blocking holes injected from the an anode. The electron transporting materials that are cited above in the explanation of the blocking layer can be preferably used.

A thickness of the electron-transport layer is preferably from 10 nm to 200 nm and more preferably from 20 nm to 80 nm.

When the thickness exceeds 1000 nm, the driving voltage increases in some cases. When it is less than 10 nm, the light-emitting efficiency of the light-emitting element may be greatly deteriorated, which is not preferable.

7) Electron-Injection Layer

In the present invention, an electron-injection layer can be disposed between the electron-transport layer and the cathode.

The electron-injection layer is a layer by which electrons can be readily injected from the cathode to the electron-transport layer. Specifically, lithium salts such as lithium fluoride, lithium chloride and lithium bromide; alkali metal salts such as sodium fluoride, sodium chloride and cesium fluoride; and electric insulating metal oxides such as lithium oxide, aluminum oxide, indium oxide and magnesium oxide can be preferably used.

A film thickness of the electron-injection layer is preferably from 0.1 nm to 5 nm.

8) Substrate

The substrate to be applied in the present invention is preferably impermeable to moisture or very slightly permeable to moisture. Furthermore, the substrate preferably does not scatter or attenuate light emitted from the organic compound layer. Specific examples of materials for the substrate include YSZ (zirconia-stabilized yttrium); inorganic materials such as glass; polyesters such as polyethylene terephthalate, polybutylene phthalate and polyethylene naphthalate; and organic materials such as polystyrene, polycarbonate, polyethersulfone, polyarylate, aryldiglycolcarbonate, polyimide, polycycloolefin, norbornene resin, polychlorotrifluoroethylene, and the like.

In case of employing an organic material, it is preferred to use a material excellent in heat resistance, dimensional stability, solvent-resistance, electrical insulation, workability, low air-permeability, and low moisture-absorption. These can be used alone or in a combination of two or more of them.

There is no particular limitation as to the shape, the structure, the size and the like of the substrate, but it may be suitably selected according to the application, the purposes and the like of the luminescent device. In general, a plate-like substrate is preferred as the shape of the substrate. The structure of the substrate may be a monolayer structure or a laminated structure. Furthermore, the substrate may be formed from a single member or from two or more members.

Although the substrate may be in a transparent and colorless, or a transparent and colored, it is preferred that the substrate is transparent and colorless from the viewpoint that the substrate does not scatter or attenuate light emitted from the organic emissive layer.

A moisture permeation preventive layer (gas barrier layer) may be provided on the front surface or the back surface (on the transparent electrode side) of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

A hard-coat layer or an under-coat layer may be further provided as necessary on the substrate.

9) Electrodes

Either one of the first electrode and the second electrode in the present invention can be an anode or a cathode. It is preferable that the first electrode is the anode and the second electrode is the cathode.

<Anode>

An anode in the present invention may generally have a function as an electrode for supplying positive holes to the organic compound layer, and while there is no particular limitation as to the shape, the structure, the size and the like, it may be suitably selected from among well-known electrode materials according to the application and the purpose of the luminescence element.

As materials for the anode, for example, metals, alloys, metal oxides, electric conductive compounds, and mixtures thereof are preferably used, wherein those having a work function of 4.0 eV or more are preferred. Specific examples of the anode materials include semi-conducting metal oxides such as tin oxides doped with antimony, fluorine or the like (ATO, and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide, and copper sulfide; organic electric conductive materials such as polyaniline, polythiophene, and polypyrrole; and laminates of these inorganic or organic electron-conductive materials with ITO.

The anode may be formed on the substrate, for example, in accordance with a method which is appropriately selected from among wet methods such as a printing method, and a coating method and the like; physical methods such as a vacuum deposition method, a sputtering method, and an ion plating method and the like; and chemical methods such as CVD and plasma CVD methods and the like with consideration of the suitability with a material constituting the anode. For instance, when ITO is selected as a material for the anode, the anode may be formed in accordance with a DC or high-frequency sputtering method, a vacuum deposition method, an ion plating method or the like. Further, when an organic electric conductive compound is selected as a material for the anode, the anode may be formed in accordance with a wet film forming method.

In the organic electroluminescence device, a position at which the anode is to be formed is not particularly restricted, and it may be suitably selected according to the application and the purpose of the luminescent device. The anode preferably formed on the substrate. In this case, the anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, and a lift-off method or a printing method may be applied.

A thickness of the anode may be suitably selected dependent on the material constituting the anode, and is not definitely decided, but it is usually in a range of from 10 nm to 50 µm, and from 50 nm to 20 µm is preferred.

A value of electric resistance of the anode is preferably $10^3$ Ω/□ or less, and $10^2$ Ω/□ or less is more preferable.

The anode can be colorless and transparent or colored and transparent. For extracting luminescence from the anode side, it is preferred that a light transmittance of the anode is 60% or higher, and more preferably 70% or higher. The light transmittance can be measured by means well known in the art using a spectrophotometer.

Concerning the anode, there is a detailed description in "TOUMEI DENNKYOKU-MAKU NO SHINTENKAI (Novel Developments in Transparent Electrode Films)" edited by Yutaka Sawada and published by C.M.C. in 1999, the contents of which are incorporated by reference herein. In the case where a plastic substrate of a low heat resistance is applied, it is preferred that ITO or IZO is used to obtain an anode prepared by forming the film at a low temperature of 150° C. or lower.

<Cathode>

The cathode in the present invention may generally have a function as a cathode for injecting electrons to the organic compound layer, and there is no particular restriction as to the shape, the structure, the size and the like. Accordingly, the cathode may be suitably selected from among well-known electrode materials according to the application and purpose of the luminescence element.

As the materials constituting the cathode, for example, metals, alloys, metal oxides, electric conductive compounds, and mixtures thereof may be used, wherein materials having a work function of 4.5 eV or less are preferred. Specific examples thoseof include alkali metals (e.g., Li, Na, K, Cs or the like); alkaline earth metals (e.g., Mg, Ca or the like); gold; silver; lead; aluminum; sodium-potassium alloys; lithium-aluminum alloys; magnesium-silver alloys; rare earth metals such as indium and ytterbium; and the like. They may be used alone, but it is preferred that two or more of them are used in combination from the viewpoint of satisfying both of stability and electron injectability.

Among these, as the materials for constituting the cathode, alkaline metals or alkaline earth metals are preferred in view of electron injectability, and materials containing aluminum as the major component are preferred in view of excellent preservation stability.

The term "material containing aluminum as the major component" refers to a material that material exists in the form of aluminum alone; alloys comprising aluminum and 0.01% by weight to 10% by weight of an alkaline metal or an alkaline earth metal; or mixtures thereof (e.g., lithium-aluminum alloys, magnesium-aluminum alloys and the like).

As for materials for the cathode, they are described in detail in JP-A Nos. 2-15595 and 5-121172, the contents of which are incorporated by reference herein.

A method for forming the cathode is not particularly limited, but it may be formed on the substrate described above, for example, in accordance with a well-known method. For instance, the cathode may be formed in accordance with a method which is appropriately selected from among wet methods such as a printing method, and a coating method and the like; physical methods such as a vacuum deposition method, a sputtering method, and an ion plating method and the like; and chemical methods such as CVD and plasma CVD methods and the like, while taking the suitability to a material constituting the cathode into consideration. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, and a lift-off method or a printing method may be applied.

In the organic electroluminescence element, a position at which the cathode is to be formed is not particularly restricted, and it may be suitably selected according to the application ad the purpose of the luminescence element. The cathode is preferably formed on the organic compound layer. In this case, the cathode may be formed on either the whole or a part of the organic compound layer.

Furthermore, a dielectric material layer made of a fluoride or the like of an alkaline metal or an alkaline earth metal may be inserted between the cathode and the organic compound layer with a thickness of 0.1 nm to 5 nm.

A thickness of the cathode may be suitably selected dependent on materials for constituting the cathode and is not definitely decided, but it is usually in a range of from 10 nm to 5 µm, and from 50 nm to 1 µm is preferred.

Moreover, the cathode may be transparent or opaque. The transparent cathode may be formed by preparing a material for the cathode with a small thickness of 1 nm to 10 nm, and further laminating a transparent electric conductive material such as ITO or IZO thereon.

10) Protective Layer

According to the present invention, the whole organic EL device may be protected by a protective layer.

A material contained in the protective layer may be one having a function to prevent penetration of substances such as moisture and oxygen, which accelerate deterioration of the device, into the device.

Specific examples thereof include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate;

polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

11) Sealing

The whole organic electroluminescence device according to the present invention may be sealed with a sealing cap.

Furthermore, a moisture absorbent or an inert liquid may be used to seal a space defined between the sealing cap and the luminescent device.

Although the moisture absorbent is not particularly limited, specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

12) Producing Method of Element

The respective layers that constitute an element in the present invention can be preferably formed by any method of dry film forming methods such as a vapor deposition method and a sputtering method, and wet film forming methods such as a dipping method, a spin coating method, a dip coating method, a casting method, a die coating method, a roll coating method, a bar coating method and a gravure coating method.

Among these, from the viewpoints of light-emission efficiency and durability, the dry methods are preferable. In the case of the wet film forming methods, a residual coating solvent unfavorably damages the light-emitting layer.

Particularly preferably, a resistance heating vacuum deposition method can be used. In the resistance heating vacuum deposition method, since only a substance that can be transpired by heating under a vacuum atmosphere can be efficiently heated, whereby the element is not exposed to a high temperature, the element is advantageously subjected to less damage.

The vacuum deposition method is a method in which, in a vacuumed vessel, a deposition material is heated to vaporize or sublimate to deposit on a surface of an adherent disposed at a slightly distanced position to form a thin film. Depending on the deposition material and the adherent, resistance heating, electron beam, high-frequency induction, laser or the like is used to carry out heating. Among these, the one that can form a layer with at the lowest temperature is the resistance heating vacuum deposition method. Although it cannot form a layer with a material having a high sublimation temperature, all materials that have a low sublimation temperature can form a layer in a state where the adherent material is hardly thermally affected.

The sealing film material in the present invention is characterized in that it can form a layer by means of the resistance heating vacuum deposition method.

A conventional sealing material such as silicon oxide, being high in sublimation temperature, has been impossible to deposit by means of resistance heating. Furthermore, in a vacuum deposition method such as an ion plating method generally described in known examples, since a vaporizing portion becomes such a high temperature as several thousands of degrees centigrade to adversely thermally affect and modify an adherent material, this method is not appropriate as a producing method of a sealing film of an organic EL device that is particularly easily affected by heat and UV rays.

13) Driving Method

In the organic electroluminescence device according to the present invention, when a DC (AC components may be contained as occasion arises) voltage (usually 2 volts to 15 volts) or DC is applied across the anode and the cathode, luminescence can be obtained.

For the driving method of the organic electroluminescence device according to the present invention, the driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

All publications, patent applications, and technical standards mentioned in this specification are herein incorporated by reference to the same extent as if each individual publication, patent application, or technical standard was specifically and individually indicated to be incorporated by reference.

What is claimed is:

1. A display comprising an active matrix drive in which plural pixels are controlled independently from one another, wherein each of the pixels includes at least two sub-pixels, the sub-pixels emit light of the same color as each other by application of current, and one sub-pixel of the sub-pixels has a lower light-emission efficiency per unit of current than that of the other sub-pixel, wherein the pixel includes a charge-injection light-emitting element, and a gradation reproduction is controlled by current values, wherein the charge-injection light-emitting element is an organic electroluminescence element.

2. The display according to claim 1, wherein the light-emission efficiency of the sub-pixel having a lower light-emission efficiency is from 5% to 60% with respect to the light-emission efficiency of the sub-pixel having a higher light-emission efficiency.

3. The display according to claim 1, wherein a light-emitting area of the sub-pixel having a lower light-emission efficiency is smaller than a light-emitting area of the sub-pixel having a higher light-emission efficiency.

4. The display according to claim 1, wherein a number of gradations of the sub-pixel having a lower light-emission efficiency is smaller than a number of gradations of the sub-pixel having a higher light-emission efficiency.

5. The display according to claim 1, wherein the organic electroluminescence element contains a phosphorescent light-emitting material as a light-emitting material.

6. The display according to claim 5, wherein a light-emitting material for the sub-pixel having a higher light-emission efficiency is the phosphorescent light-emitting material.

7. The display according to claim 1, wherein the organic electroluminescence element is a top emission organic electroluminescence element.

8. The display according to claim 1, wherein the display is a full color display.

* * * * *